(12) United States Patent
Schuhmacher et al.

(10) Patent No.: US 10,323,292 B2
(45) Date of Patent: Jun. 18, 2019

(54) METHOD FOR PRODUCING A STEEL COMPONENT WHICH IS SHAPED BY HOT-FORMING A STEEL SHEET WHICH HAS A METAL COATING, SUCH A STEEL SHEET, AND A STEEL COMPONENT PRODUCED FROM SAID STEEL SHEET BY MEANS OF A HOT-FORMING PROCESS

(71) Applicants: ThyssenKrupp Steel Europe AG, Duisburg (DE); ThyssenKrupp AG, Essen (DE)

(72) Inventors: Bernd Schuhmacher, Dortmund (DE); Christian Schwerdt, Duisburg (DE); Axel Schrooten, Dortmund (DE); Ralf Bause, Dortmund (DE)

(73) Assignees: ThyssenKrupp Steel Europe AG, Duisburg (DE); ThyssenKrupp AG, Essen (DE)

( * ) Notice: Subject to any disclaimer, the term of this patent is extended or adjusted under 35 U.S.C. 154(b) by 231 days.

(21) Appl. No.: 15/309,365

(22) PCT Filed: Apr. 29, 2015

(86) PCT No.: PCT/EP2015/059397
§ 371 (c)(1),
(2) Date: Nov. 7, 2016

(87) PCT Pub. No.: WO2015/173023
PCT Pub. Date: Nov. 19, 2015

(65) Prior Publication Data
US 2017/0073789 A1 Mar. 16, 2017

(30) Foreign Application Priority Data
May 12, 2014 (EP) .................... 14167917

(51) Int. Cl.
| | | |
|---|---|---|
| *C23C 14/58* | (2006.01) |
| *C23C 14/00* | (2006.01) |
| *C25D 3/44* | (2006.01) |
| *C25D 3/20* | (2006.01) |
| *C21D 8/00* | (2006.01) |
| *C21D 7/13* | (2006.01) |
| *B32B 15/01* | (2006.01) |
| *B32B 15/18* | (2006.01) |
| *B32B 15/20* | (2006.01) |
| *C21D 9/00* | (2006.01) |
| *C23C 14/02* | (2006.01) |
| *C21D 1/673* | (2006.01) |
| *C23C 14/16* | (2006.01) |
| *C23C 14/30* | (2006.01) |
| *C23C 14/56* | (2006.01) |
| *C21D 8/04* | (2006.01) |
| *C22C 21/00* | (2006.01) |
| *C22C 38/00* | (2006.01) |
| *C21D 1/18* | (2006.01) |
| *C22C 21/06* | (2006.01) |
| *C22C 38/06* | (2006.01) |
| *C25D 13/12* | (2006.01) |
| *C25D 13/20* | (2006.01) |

(52) U.S. Cl.
CPC .......... *C21D 9/0068* (2013.01); *B32B 15/011* (2013.01); *B32B 15/012* (2013.01); *C21D 1/18* (2013.01); *C21D 1/673* (2013.01); *C21D 8/005* (2013.01); *C21D 8/0478* (2013.01); *C22C 21/00* (2013.01); *C22C 21/06* (2013.01); *C22C 38/00* (2013.01); *C22C 38/06* (2013.01); *C23C 14/025* (2013.01); *C23C 14/16* (2013.01); *C23C 14/30* (2013.01); *C23C 14/562* (2013.01); *C23C 14/5806* (2013.01); *C25D 3/20* (2013.01); *C21D 2251/02* (2013.01); *C25D 13/12* (2013.01); *C25D 13/20* (2013.01)

(58) Field of Classification Search
None
See application file for complete search history.

(56) References Cited

U.S. PATENT DOCUMENTS

2012/0295130 A1* 11/2012 Nose .................... B32B 15/012
428/653

FOREIGN PATENT DOCUMENTS

| EP | 0 971 044 B1 | 5/2003 |
| EP | 1 143 029 B1 | 5/2006 |

(Continued)

OTHER PUBLICATIONS

Machine-English translation of JP 2007-302982, Kurosaki Masao et al., Nov. 22, 2007.*

(Continued)

*Primary Examiner* — Deborah Yee
(74) *Attorney, Agent, or Firm* — Lathrop Gage L.L.P.

(57) ABSTRACT

A process for producing a three-dimensionally shaped steel component from a steel sheet with a metallic coating may involve hot forming the steel sheet into the steel component. The metallic coating may involve an Fe—Al-based alloy. To protect the steel sheet or the steel component against scale formation, the Fe—Al-based alloy may be applied directly to the steel sheet by galvanic coating and/or physical vapor deposition. The coating produced in this way may contain 30-60% by weight Fe, a balance of Al, and, in some cases, 0.1-10% by weight Mg, 0.1-5% by weight Ti, 0.1-10% by weight Si, 0.1-10% by weight Li, and/or 0.1-10% by weight Ca. Before heating the coated steel sheet as part of the hot forming process, the coated steel sheet may have an Fe—Al phase is stable to above 900° C.

21 Claims, No Drawings

(56) References Cited

FOREIGN PATENT DOCUMENTS

| EP | 1 013 785 B1 | 10/2006 |
|---|---|---|
| EP | 2312005 A1 | 4/2011 |
| JP | H03257155 A | 11/1991 |
| JP | 2009120942 A | 6/2009 |
| JP | 2010018860 A | 1/2010 |
| JP | 2011137210 A | 7/2011 |
| WO | 2007/048895 A1 | 5/2007 |
| WO | 2010005121 A1 | 1/2012 |

OTHER PUBLICATIONS

S. Paldey et al., "Cathodic arc deposited FeAl coatings: properties and oxidation characteristics." Materials Science and Engineering A. vol. 355. No. 1-2. Aug. 25, 2003 (Aug. 25, 2003). pp. 208-215 & Introduction. Experimental procedure; paragraph [0001]-paragraph [0002]; XP055147246. ISSN: 0921-5093. DOI: 10.1016/S0921-5093(03)00076-5.

Int'l Search Report for PCT/EP2015/059397 dated Jul. 13, 2015 (dated Jul. 28, 2015).

Translation of Japanese Application No. 2016-567670, Office Action dated Feb. 26, 2019, six pages.

\* cited by examiner

METHOD FOR PRODUCING A STEEL COMPONENT WHICH IS SHAPED BY HOT-FORMING A STEEL SHEET WHICH HAS A METAL COATING, SUCH A STEEL SHEET, AND A STEEL COMPONENT PRODUCED FROM SAID STEEL SHEET BY MEANS OF A HOT-FORMING PROCESS

CROSS REFERENCE TO RELATED APPLICATIONS

This application is a U.S. National Stage Entry of International Patent Application Serial Number PCT/EP2015/059397, filed Apr. 29, 2015, which claims priority to European Patent Application No. EP 14167917.5 filed May 12, 2014, the entire contents of both of which are incorporated herein by reference.

FIELD

The present disclosure relates to steel components and processes for forming such steel components from steel sheets with metallic coatings.

BACKGROUND

When steel is heated to temperatures above about 500° C. in an oxygen-containing atmosphere, an oxide layer, known as scale, is formed on the steel surface. Scale formation is generally undesirable since it presents considerable problems. Thus, pressing-in of the scale during forming of the steel sheet can lead to surface marks and to an unsatisfactory or completely unacceptable surface quality. Owing to its high hardness, the scale increases wear of the transport rollers carrying the steel sheet to be formed and also the forming tools. Removal of the scale induces additional costs.

DETAILED DESCRIPTION

Although certain example methods and apparatus have been described herein, the scope of coverage of this patent is not limited thereto. On the contrary, this patent covers all methods, apparatus, and articles of manufacture fairly falling within the scope of the appended claims either literally or under the doctrine of equivalents. Moreover, those having ordinary skill in the art will understand that reciting 'a' element or 'an' element in the appended claims does not restrict those claims to articles, apparatuses, systems, methods, or the like having only one of that element.

The present disclosure generally concerns processes for producing three-dimensionally shaped steel components from a steel sheet that has a metallic coating and may be heated and subsequently formed into a steel component by hot forming. In some examples, the steel sheet may utilize a Fe—Al-based alloy as a metallic coating. The present disclosure further concerns steel sheets for producing one or more steel components produced by hot forming, which may be provided with a metallic coating comprised of a Fe—Al-based alloy. In addition, the present disclosure concerns shaped steel components that have been produced by hot forming of steel sheets of this type.

One example object of the present disclosure is to provide a process of the type mentioned above in which the problems of scale formation are largely avoided. In particular, an example object of the present disclosure is to make available a steel sheet that is provided with a metallic coating that protects against scale and is specifically designed for components to be produced by hot forming.

To protect the steel sheet or a steel component produced therefrom by hot forming (press hardening) from scale formation, an Fe—Al-based alloy is applied directly to the steel sheet by a galvanic coating process and/or physical vapor deposition, where the coating produced in this way contains 30-60% by weight of Fe, balance Al and optionally 0.1-10% by weight of Mg and/or 0.1-5% by weight of Ti and/or 0.1-10% by weight of Si and/or 0.1-10% by weight of Li and/or 0.1-10% by weight of Ca, and even before the heating of the coated steel sheet to be carried out for the hot forming has an Fe—Al phase which is stable to above 900° C.

In contrast to a coating with an intermetallic alloy layer which is produced by "preliminary annealing", the Fe-based or Fe—Al-based alloy is applied directly according to the invention. Galvanic coating processes and physical vapor deposition (known as PVD processes) are particularly suitable for this purpose. Both processes allow a continuous coating process. A combination of the two coating processes and also a combination with hot dip processes are within the scope of the present invention for obtaining the Fe—Al-based coating.

The coating according to the invention has the following advantages:

1. The reaction of the coating with the furnace components of the hot forming plant, in particular the ceramic transport rollers, is prevented by the stabilized Fe—Al phase. This has positive effects on the surface quality of the coated steel sheet and reduces the maintenance requirement for the furnace.
2. The previously prealloyed coating can be heated significantly more quickly as a result of improved emissivity (absorption capability), which make shortening of the hot forming process possible. This leads to an increase in the productivity and a reduction in the production costs for the press-hardened steel components produced.
3. The wear of the forming tool is reduced by the reduction of bake-on material resulting from not yet fully alloyed ("doughy") coating constituents. This also reduces shutdown times and saves costs.

The optional alloying constituents magnesium, titanium, silicon, lithium and calcium have a higher corrosion potential than iron, which effects a certain degree of cathodic protection in any damaged regions of the press-hardened coating. Owing to the tendency for a low-melting phase with aluminum to be formed and the associated risk of liquid phase-induced cracks, zinc is not used as alloying element in the coating of the invention.

A particular embodiment of the invention is characterized in that the Fe—Al-based alloy contains at least 28% by weight of Al, particularly preferably at least 38% by weight of Al. This increases the protective effect against scale formation without having an adverse effect on the base material.

In a further advantageous embodiment of the invention, the Fe—Al-based alloy contains 0.1-10% by weight of Mg and/or 0.1-5% by weight of Ti. The alloying constituents magnesium and titanium have a positive effect on the surface of the coating. Experiments have shown that an optimal roughness which firstly leads to improved corrosion protection due to a reduced base roughness (Ra, Rz) and secondly gives an increased peak count (RPc) as a result of which adhesion of the surface coating applied in the electrophoretic coating process is improved, is set in a further process window.

It is also advantageous for the Fe—Al-based alloy to contain 0.1-10% by weight of Li and/or 0.1-10% by weight of Ca in a further preferred embodiment. Experiments have shown that the cathodic corrosion protection can be significantly improved thereby. This also applies particularly to the addition of magnesium.

Particularly good results in respect of the protected effect against scale formation and corrosion can be achieved when the Fe—Al-based alloy contains, in a further preferred embodiment, not more than 20% by weight, in particular not more than 15% by weight and preferably not more than 12% by weight, of the alloying elements from the group consisting of Mg, Ti, Si, Li and Ca.

Heat treatment of the previously coated or uncoated steel substrate before use of the PVD process, or subsequent heating to 250-500° C., bring about an improvement in adhesion of the layer. If hot dip coating is subsequently employed, additional heating becomes unnecessary.

To produce weight-reduced steel components having very good mechanical properties, the steel sheet can, in a further embodiment of the process of the invention, be hardened by rapid cooling during hot forming and/or after hot forming.

The invention will be illustrated below with the aid of working examples (experiments).

EXPERIMENT 1

A base material, for example a press-hardenable steel of the type 22MnB5, was coated with about 60% by weight of Al and about 39% by weight of Fe plus about 1% by weight of Ti by means of physical vapor deposition (PVD) in a continuous coating process. This was achieved by simultaneous deposition of iron and titanium by means of an electron beam vaporizer and deposition of aluminum in a separate thermal PVD process step. A layer thickness of about 8 µm was obtained. This layer was subsequently after-densified thermally at about 500° C. and a treatment time (hold time) of about 60 seconds in a continuous furnace. The thermal after-densification serves to improve adhesion of the layers and also initial alloy formation by solid-state diffusion.

The steel strip produced in this way in the continuous strip coating process was subsequently, according to the further processes at the customer, cut into metal blanks and sent to the press hardening process. A metallic coating (coating) containing about 55% by weight of Fe and about 45% by weight of Al and also an aluminum oxide and titanium oxide layer having a thickness of only about 150 nm were formed in the heating-up phase which had been shortened from 6 minutes to 3 minutes in a laboratory press hardening furnace. The coating had a base roughness of Ra=0.8-1 µm and RPC=150-200 which was very suitable for further processing, in particular painting.

It was found that bake-on of aluminum was not observed neither on the ceramic transport rollers of the continuous furnace nor on the forming tools.

It was surprisingly, also found that the base roughness which was reduced compared to a reference sheet having an aluminum-silicon coating leads to an improvement in corrosion protection on steel components coated in the electrophoretic coating process.

EXPERIMENT 2

A base material, e.g. press-hardenable steel of the type 22MnB5, was coated with about 50% by weight of Al and about 45% by weight of Fe plus about 5% by weight of Mg by means of physical vapor deposition in a continuous coating process. This was achieved by simultaneous deposition of aluminum and magnesium by means of jet-PVD from separate crucibles and also deposition of iron in a separation coating step by means of electron beam vaporization. The layer thickness obtained in this way was about 8 µm. This layer was subsequently after-densified thermally at about 400° C. for about 60 seconds in a continuous furnace. The thermal after-densification serves to improve the adhesion of the layers and also for initial alloy formation by solid-state diffusion.

The steel strip produced in this way in the continuous strip coating process was subsequently, according to the further processes at the customer, cut into metal blanks and sent to the press hardening process. A metallic coating containing about 55% by weight of Fe, about 42% by weight of Al and about 3% by weight of magnesium and also an aluminum oxide and magnesium oxide layer having a thickness of about 1 µm were formed in the heating-up phase which had been shortened from 6 minutes to 3.5 minutes in a laboratory press hardening furnace. The coating had a base roughness of Ra=1-2.2 µm and RPC=100-120 which was very suitable for further processing, in particular painting.

It was found that bake-on of aluminum was not observed neither on the ceramic transport rollers of the continuous furnace nor on the forming tools.

It was surprisingly also found that the corrosion depth into the steel sheet, determined by examination at a score mark and the edge of the sheet as is typical for automobile applications, on components coated in the electrophoretic coating process is, owing to the magnesium present, significantly smaller than in the case of fine steel sheet having a standard aluminum-silicon coating.

EXPERIMENT 3

An about 4 µm thick Fe layer was firstly applied electrolytically to a base material, e.g. press-hardenable steel of the type 22MnB5. Subsequently, after the substrate had been heated to 350° C., an about 6 µm thick aluminum-magnesium layer was applied by means of a thermal PVD process. The two alloying constituents (Al and Mg) were deposited simultaneously from two separate crucibles. The resulting Al layer had an Mg content of about 10% by weight.

This layer also generally gives long-term passive corrosion protection on the steel substrate of the press-hardened component.

The steel strip produced in this way in the continuous strip coating process was subsequently, according to the further processes at the customer, cut into metal blanks and sent to the press hardening process. A metallic coating (coating) containing about 60% by weight of Fe, about 37% by weight of Al and about 3% by weight of magnesium and also an aluminum oxide and magnesium oxide layer having a thickness of about 1 µm were formed in the heating-up phase which had been shortened from 6 minutes to 3.5 minutes in a laboratory press hardening furnace. The coating had a base roughness of Ra=1-2.2 µm and RPC=100-120 which was very suitable for further processing, in particular painting.

It was found that bake-on of aluminum was not observed neither on the ceramic transport rollers of the continuous furnace nor on the forming tools.

In addition, it was surprisingly found that the corrosion depth into the steel substrate, determined by examination at a score mark and the edge of the sheet as is typical for automobile applications, on components coated in the electrophoretic coating process is, owing to the magnesium present, significantly smaller than in the case of fine steel sheet having a standard aluminum-silicon coating.

What is claimed is:

1. A process for producing a three-dimensionally shaped steel component from a steel sheet, the process comprising:
   applying a metallic coating comprising an Fe—Al based alloy directly to a steel sheet by at least one of hot dip coating or physical vapor deposition, wherein the metallic coating applied in this way includes 30-60% by weight Fe, and a balance of Al; wherein the deposition of one of Fe or Al to the steel sheet occurs in a separate coating process than the deposition of the remaining alloying element; and
   hot forming the steel sheet into a steel component, and wherein prior to heating the steel sheet as part of the hot forming, the steel sheet has an Fe—Al phase that is stable to above 900° C.

2. The process of claim 1, wherein the metallic coating further includes
   0.1-10% by weight Mg;
   0.1-5% by weight Ti;
   0.1-10% by weight Si;
   0.1-10% by weight Li; and
   0.1-10% by weight Ca.

3. The process of claim 1, wherein the metallic coating further includes at least one of
   0.1-10% by weight Mg;
   0.1-5% by weight Ti;
   0.1-10% by weight Si;
   0.1-10% by weight Li; or
   0.1-10% by weight Ca.

4. The process of claim 1, wherein the Fe—Al based alloy includes at least 28% by weight Al.

5. The process of claim 1, wherein the Fe—Al based alloy includes at least 38% by weight Al.

6. The process of claim 1, wherein the Fe—Al based alloy includes at least one of 0.1-10% by weight Mg or 0.1-5% by weight Ti.

7. The process of claim 1, wherein the Fe—Al based alloy includes at least one of 0.1-10% by weight Li or 0.1-10% by weight Ca.

8. The process of claim 1, wherein the Fe—Al based alloy includes not more than 20% by weight of alloying elements from a group consisting of Mg, Ti, Si, Li, and Ca.

9. The process of claim 1, further comprising hardening the steel sheet by rapid cooling during hot forming or during and after hot forming.

10. A steel sheet for producing one or more steel components by hot forming, the steel sheet comprising a metallic coating including an Fe—Al based alloy applied directly to the steel sheet by a physical vapor deposition or a combination of a hot dip coating and a physical vapor deposition, wherein the metallic coating applied in this way includes 30-60% by weight Fe and a balance of at least 28% by weight of Al, wherein the deposition of one of Fe or Al to the steel sheet is in a separate coating process than the deposition of the remaining alloying element, and wherein prior to heating the steel sheet as part of any hot forming the steel sheet has an Fe—Al phase that is stable to above 900° C.

11. The steel sheet of claim 10, wherein the metallic coating further includes
    0.1-10% by weight Mg;
    0.1-5% by weight Ti;
    0.1-10% by weight Si;
    0.1-10% by weight Li; and
    0.1-10% by weight Ca.

12. The steel sheet of claim 11, wherein the metallic coating further includes at least one of
    0.1-10% by weight Mg;
    0.1-5% by weight Ti;
    0.1-10% by weight Si;
    0.1-10% by weight Li; or
    0.1-10% by weight Ca.

13. The steel sheet of claim 11 wherein the Fe—Al based alloy includes at least 28% by weight Al.

14. The steel sheet of claim 11 wherein the Fe—Al based alloy includes at least 38% by weight Al.

15. The steel sheet of claim 11 wherein the Fe—Al based alloy includes at least one of 0.1-10% by weight Mg or 0.1-5% by weight Ti.

16. The steel sheet of claim 11 wherein the Fe—Al based alloy includes at least one of 0.1-10% by weight Li or 0.1-10% by weight Ca.

17. The steel sheet of claim 11 wherein the Fe—Al based alloy includes not more than 20% by weight of alloying elements from a group consisting of Mg, Ti, Si, Li, and Ca.

18. The process of claim 1, wherein the deposition of one of Fe or Al to the steel sheet may be electron-beam physical vapor deposition or thermal physical vapor deposition.

19. A process for producing a three-dimensionally shaped steel component from a steel sheet, the process comprising:
    applying a metallic coating comprising an Fe—Al based alloy by a physical vapor deposition or a combination of a hot dip coating and a physical vapor deposition directly to a steel sheet, wherein the metallic coating applied in this way includes
    30-60% by weight Fe,
    at least one alloying element selected from the group of:
    0.1-10% by weight Mg;
    0.1-5% by weight Ti;
    0.1-10% by weight Si;
    0.1-10% by weight Li; or
    0.1-10% by weight Ca, and
    a balance of at least 28% by weight Al;
    wherein the coating includes not more than 20% by weight of alloying elements from the group consisting of Mg, Ti, Si, Li and Ca, and wherein the deposition of one of Fe or Al to the steel sheet is in a separate coating process than the deposition of the remaining alloying elements and the remaining alloying elements are applied to the steel sheet simultaneously, and
    hot forming the steel sheet into the three-dimensionally shaped steel component,
    wherein a heat treatment of the steel sheet to 250-500° C. is performed before or subsequent to vapor deposition, so that prior to heating the steel sheet as part of the hot forming, the steel sheet has an Fe—Al phase that is stable to above 900° C.

20. The process of claim 19, wherein the metallic coating includes at least 38% by weight Al.

21. The process of claim 19, further comprising hardening the steel sheet by rapid cooling during hot forming or during and after hot forming.

* * * * *